(12) United States Patent
Deczky

(10) Patent No.: US 7,716,563 B2
(45) Date of Patent: May 11, 2010

(54) METHOD AND APPARATUS FOR THE EFFICIENT IMPLEMENTATION OF A TOTALLY GENERAL CONVOLUTIONAL INTERLEAVER IN DMT-BASED XDSL SYSTEMS

(75) Inventor: Andrew G. Deczky, Ottawa (CA)

(73) Assignee: Ciena Corporation, Linthicum, MD (US)

( * ) Notice: Subject to any disclaimer, the term of this patent is extended or adjusted under 35 U.S.C. 154(b) by 774 days.

(21) Appl. No.: 11/290,363

(22) Filed: Nov. 30, 2005

(65) Prior Publication Data

US 2006/0156173 A1 Jul. 13, 2006

Related U.S. Application Data

(60) Provisional application No. 60/631,775, filed on Nov. 30, 2004.

(51) Int. Cl.
*H03M 13/03* (2006.01)
*G06F 11/00* (2006.01)
*G11C 29/00* (2006.01)

(52) U.S. Cl. .................. 714/787; 714/701; 714/702; 714/788

(58) Field of Classification Search .................. 714/701, 714/702, 787, 788
See application file for complete search history.

(56) References Cited

U.S. PATENT DOCUMENTS

| | | | | | |
|---|---|---|---|---|---|
| 4,547,887 | A | * | 10/1985 | Mui | 375/285 |
| 5,241,563 | A | * | 8/1993 | Paik et al. | 375/262 |
| 5,483,541 | A | * | 1/1996 | Linsky | 714/701 |
| 5,519,734 | A | * | 5/1996 | Ben-Efraim | 375/341 |
| 5,537,420 | A | * | 7/1996 | Huang | 714/701 |
| 5,592,492 | A | * | 1/1997 | Ben-Efraim et al. | 714/702 |
| 5,719,875 | A | * | 2/1998 | Wei | 714/701 |
| 5,745,497 | A | * | 4/1998 | Ben-Efraim et al. | 714/702 |
| 5,761,249 | A | * | 6/1998 | Ben-Efraim | 375/341 |
| 5,771,239 | A | * | 6/1998 | Moroney et al. | 370/474 |
| 5,886,989 | A | * | 3/1999 | Evans et al. | 370/347 |
| 5,912,898 | A | * | 6/1999 | Khoury | 714/701 |
| 6,035,427 | A | * | 3/2000 | Kweon | 714/702 |
| 6,151,690 | A | * | 11/2000 | Peeters | 714/701 |
| 6,178,530 | B1 | * | 1/2001 | Aman et al. | 714/702 |
| 6,411,654 | B1 | * | 6/2002 | Furutani et al. | 375/262 |
| 6,421,796 | B1 | * | 7/2002 | Gatherer | 714/702 |
| 6,546,520 | B1 | * | 4/2003 | Cameron | 714/788 |
| 6,697,975 | B2 | * | 2/2004 | Cameron | 714/702 |
| 6,785,862 | B1 | * | 8/2004 | Zhang | 714/788 |
| 6,927,708 | B2 | * | 8/2005 | Fimoff | 341/81 |
| 7,024,596 | B2 | * | 4/2006 | Xin | 714/702 |
| 7,024,597 | B2 | * | 4/2006 | Cameron | 714/702 |
| 7,032,138 | B2 | * | 4/2006 | Cameron | 714/701 |
| 7,051,171 | B1 | * | 5/2006 | Liu et al. | 711/157 |
| 7,185,241 | B2 | * | 2/2007 | Ko et al. | 714/701 |
| 7,363,552 | B2 | * | 4/2008 | Huang et al. | 714/702 |
| 7,376,882 | B2 | * | 5/2008 | Friddell | 714/755 |
| 7,408,999 | B2 | * | 8/2008 | Xue et al. | 375/262 |
| 7,409,626 | B1 | * | 8/2008 | Schelstraete | 714/774 |

\* cited by examiner

*Primary Examiner*—Joseph D Torres
(74) *Attorney, Agent, or Firm*—Clements Bernard PLLC; Christopher L. Bernard; Tyler S. Brown

(57) ABSTRACT

The present invention provides a method and apparatus for the efficient implementation of a totally general convolutional interleaver in a discrete multi-tone (DMT)-based digital subscriber line (xDSL) system, such as a modem or the like, that uses forward error correction (FEC) and convolutional interleaving to combat the effects of impulse noise and the like. More specifically, the present invention provides a method and apparatus for implementing a general convolutional interleaver, with no constraints, in an efficient manner, using $(D-1)*(I-1)/2$ memory locations for the interleaved data in all cases.

13 Claims, No Drawings

METHOD AND APPARATUS FOR THE EFFICIENT IMPLEMENTATION OF A TOTALLY GENERAL CONVOLUTIONAL INTERLEAVER IN DMT-BASED XDSL SYSTEMS

CROSS-REFERENCE TO RELATED APPLICATION(S)

The present non-provisional patent application/patent claims the benefit of priority of U.S. Provisional Patent Application No. 60/631,775, filed on Nov. 30, 2004, and entitled "METHOD AND APPARATUS FOR THE EFFICIENT IMPLEMENTATION OF A TOTALLY GENERAL CONVOLUTIONAL INTERLEAVER IN DMT-BASED xDSL SYSTEMS," which is incorporated in-full by reference herein.

FIELD OF THE INVENTION

The present invention relates generally to the telecommunications and networking fields. More specifically, the present invention relates to a method and apparatus for the efficient implementation of a totally general convolutional interleaver in a discrete multi-tone (DMT)-based digital subscriber line (xDSL) system, such as a modem or the like, that uses forward error correction (FEC) and convolutional interleaving to combat the effects of impulse noise and the like.

BACKGROUND OF THE INVENTION

Conventional high-speed communications on copper media (e.g. standard telephone lines) and the like utilize DMT technology and are bundled under the umbrella of xDSL. Several variants of this technology are currently deployed, namely asymmetric digital subscriber line (ADSL), asymmetric digital subscriber line 2 (ADSL2), asymmetric digital subscriber line 2 plus (ADSL2plus), and very high-speed digital subscriber line (VDSL). Some of these technologies are standardized by the International Telecommunications Union (ITU), Geneva, as follows: "ITU-T Recommendation G992.1, Asymmetric Digital Subscriber Line (ADSL)," "ITU-T Recommendation G992.3, Asymmetric Digital Subscriber Line Transceivers 2 (ADSL2)," "ITU-T Recommendation G992.5, Asymmetric Digital Subscriber Line (ADSL) Transceivers—Extended Bandwidth ADSL2 (ADSL2plus)," and "ITU-T Recommendation G993.1, Very High-Speed Asymmetric Digital Subscriber Line (VDSL) Transceivers." Future technologies are the subject of ongoing standardization efforts.

One key feature of such xDSL systems is the use of FEC to combat the effects of impulse noise and the like. To enhance the effectiveness of FEC, a convolutional interleaver is utilized to spread error patterns over a plurality of DMT symbols, thus allowing for the correction of errors without introducing excessive redundancy, and hence overhead. The convolutional interleaver is defined by the following relationship:

$$\Delta_j = (D-1)j, j=1, \ldots, I-1,$$

where $\Delta_j$ is the distance between two interleaved bytes, D is the interleaver depth in bytes, and I is the interleaver block size in bytes.

A necessary condition of such a convolutional interleaver is that D and I must be co-prime (i.e. have no common divisor). This is enforced in several different ways:

in ADSL $D=2^n$, I=N=odd integer, and in VDSL $D=M \cdot I+1$, with $N=q \cdot I$, where q is an integer. A generalized form of the above VDSL convolutional interleaver has also been considered where:

in any DSL $D=M \cdot I+x$, with $N=q \cdot I$, $x=1, \ldots, I-1$, with the constraint that x is chosen such that D and I are co-prime.

The VDSL form of the convolutional interleaver wherein:

$$D=M \cdot I+1, \text{ with } N=q \cdot I$$

has been referred to as "triangular" due to an implementation known to those of ordinary skill in the art utilizing shift registers of varying sizes in a triangular pattern. Such a convolutional interleaver needs only $(D-1)*(I-1)/2$ memory locations. However, in all other cases, and in the most general case where there is no structural relationship between N and D (for example, when N and D are co-prime, or when N is prime and is greater than D), this method cannot be applied.

Thus, what is needed is an improved method and apparatus for implementing a general convolutional interleaver, with no constraints, in an efficient manner, using $(D-1)*(I-1)/2$ memory locations for the interleaved data in all cases.

BRIEF SUMMARY OF THE INVENTION

In various exemplary embodiments, the present invention provides an improved method and apparatus for implementing a general convolutional interleaver, with no constraints, in an efficient manner, using $(D-1)*(I-1)/2$ memory locations for the interleaved data in all cases.

In one exemplary embodiment of the present invention, a method for implementing a general convolutional interleaver, with no constraints, in an efficient manner, using $(D-1)*(I-1)/2$ memory locations for the interleaved data in all cases, includes: dividing an incoming data stream into blocks of I bytes; mapping each member of a block into a set of first-in, first-out shift registers (FIFOs) arranged in rows, wherein the number of elements in a row j is given by:

$$nd(j)=int(j \cdot D/I), j=0, \ldots, I-1$$

wherein int(x) is an integer part of x; wherein, as each element is entered, a FIFO is shifted to the right and a last element is read out to an output stream; and wherein the order in which the elements are read is different from the order in which they are written.

In another specific embodiment of the present invention, an apparatus for implementing a general convolutional interleaver, with no constraints, in an efficient manner, using $(D-1)*(I-1)/2$ memory locations for the interleaved data in all cases, includes: means for dividing an incoming data stream into blocks of I bytes; means for mapping each member of a block into a set of first-in, first-out shift registers (FIFOs) arranged in rows, wherein the number of elements in a row j is given by:

$$nd(j)=int(j \cdot D/I), j=0, \ldots, I-1,$$

wherein int(x) is an integer part of x; wherein, as each element is entered, a FIFO is shifted to the right and a last element is read out to an output stream; and wherein the order in which the elements are read is different from the order in which they are written.

Preferably, the apparatus of the present invention is an xDSL modem or the like, and the method of the present invention is implemented thereon.

DETAILED DESCRIPTION OF THE INVENTION

The present invention provides an improved method and apparatus for implementing a general convolutional interleaver, with no constraints, in an efficient manner, using $(D-1)*(I-1)/2$ memory locations for the interleaved data in all cases.

Considering the general case where I=N, it is assumed that D and I are given and that they are co-prime. The method starts by dividing an incoming data stream into blocks of I bytes. Each member of a block is mapped into a set of first-in, first-out shift registers (FIFOs) arranged in rows, where the number of elements in row j is given by:

$$nd(j)=int(j \cdot D/I), j=0,\ldots,I-1,$$

where int(x) is the integer part of x.

As the next element is entered, the FIFO is shifted to the right and the last element is read out to the output stream. However, the order in which the elements are read is different from the order in which they are written. The indices of the rows read is given by id(j):

$$r(j)=rem(j \cdot D/I)=j \cdot D-nd) \cdot I, j=0,\ldots,I'1, \text{ and}$$

$$id(r(j))=j, j=0,\ldots,I-1.$$

For those rows where nd(j)=0, no data is stored, but the input data is directly passed to the output. This process is illustrated in the following simple example. Let D=4 and N=I=7. In this case:

$$nd=0\ 0\ 1\ 1\ 2\ 2\ 3,$$

$$id=0\ 2\ 4\ 6\ 1\ 3\ 5.$$

Let the input data stream be $x_0, x_1, \ldots$, and the output data stream be $y_0, y_1, \ldots$. A read-before-write strategy is implemented, where the FIFO output is read before the next element is input and the FIFO is shifted. Assuming that the FIFO is empty at the beginning, rows 0, 2, 4, 6, 1, 3, and 5 are read, in that order. Since nd(0)=0, the input data is directly passed to the output, so the first output sample is $y_0=x_0$. Rows 2, 4, and 6 have nothing in the last element of the FIFO, so y is zero for these. Row 1 is read next and nd(1)=0, so again the input is passed to the output for this case. After one cycle of seven samples:

$$y_0:y_6=[x_0\ 0\ 0\ 0\ x_1\ 0\ 0].$$

The next seven samples of x are then input to the FIFO, where the first and second rows contain zero elements. Thus, these are not stored as they have already been passed to the output. After this cycle, the FIFO looks like this:

| row | | | |
|---|---|---|---|
| 0 | | | |
| 1 | | | |
| 2 | $x_2$ | | |
| 3 | $x_3$ | | |
| 4 | $x_4$ | 0 | |
| 5 | $x_5$ | 0 | |
| 6 | $x_6$ | 0 | 0, | where the numbering of rows includes the zero-length FIFOs. Reading out the next set of samples provides:

$$y_7:y_{13}=[x_7 x_2 0\ 0 x_8 x_3 0]$$

which corresponds to reading the last elements in rows 0, 2, 4, 6, 1, 3, and 5 and passing the next input for rows 0 and 1 directly to the output. This is followed by a write cycle of seven elements, resulting in the following FIFO contents:

| row | | | |
|---|---|---|---|
| 0 | | | |
| 1 | | | |
| 2 | $x_9$ | | |
| 3 | $x_{10}$ | | |
| 4 | $x_{11}$ | $x_4$ | |
| 5 | $x_{12}$ | $x_5$ | |
| 6 | $x_{13}$ | $x_6$ | 0. |

The next read cycle would then give the following output:

$$y_{14}:y_{20}=[x_{14} x_9 x_4 0 x_{15} x_{10} x_5].$$

Note that the total umber of non-zero FIFO locations is $(D-1)*(N-1)/2=9$, as expected.

It will be apparent to those of ordinary skill in the art that the above method could be implemented directly in an integrated circuit device using shift registers, as defined above. In such an implementation, the shift registers have to be defined for the worst case of D and I, and if smaller values are used, the extra stages are not used. This leads to a complicated control mechanism for controlling the size of the individual shift registers used as the convolutional interleaver is reconfigured. A more flexible implementation is obtained if the shift registers are mapped to a general memory structure, as described below.

To map the contents of the FIFOs to a linear memory array, two pointers are formed—a write pointer offset to write the data to the memory and a read pointer offset to read the data. For each block, the pointers cycle through I values. The write pointer offset is defined simply as the number of elements in each row of the FIFOs:

$$dwp(j)=int(j \cdot D/I), j=0,\ldots,I-1,$$

and the read pointer offset is defined as:

$$drp(k) = \text{summation}\,(j = 0 \text{ to } id(k) - 1) dwp(j), \text{ if } id(k) \geq 1, \text{ and}$$

$$= 0 \text{ if } id(k) = 0.$$

In addition, a flag is defined to indicate if the target row to be read has zero elements, as follows:

$fl(k) = 1$ if $wp(id(k)) \neq 0$, and $= 0$ if $wp(id(k)) = 0$.

The process starts by setting wp to zero. I bytes are then read from the memory at the locations specified by the read pointer, except that reads corresponding to rows with zero bytes (dwp=0) are taken directly from the input stream.

Designating the next input from the input stream as "in" and the next output to the output stream as "out", the read operation becomes:

```
for j = 0 : I - 1
    if (fl(j) = 0)
        out = in;
    endif
    rp = b + (wp + drp(j))_ml
    out = mem(rp)
endfor,
``` where ml is the size of the memory $(D-1)*(I-1)/2$, b is the first location of the memory, and $(x)_m$ stands for the modulo operation—the remainder after x is divided by m.

I bytes are next written to the memory at locations specified by a write pointer, with the exception that no data is written for rows corresponding to dwp=0. Thus, the write operation becomes:

```
for j = 0 : I - 1
    if (dwp(j) ≠ 0)
        wp = b + (wp + dwp(j)))_ml
        mem(wp) = in
    endif
endfor.
```

Note that, at the end of the write cycle, wp returns to its original value because:

summation($j=0$ to $I-1$)$int(D/I)=ml$.

At this point, wp is incremented by 1 modulo ml and the cycle is repeated.

Illustrating this process with the above example:

D=4

I=7 ml=9 dwp=0 0 1 1 2 2 3 drp=0 0 2 6 0 1 4 fl=0 1 1 1 0 1 1 b=0.

During the first read cycle, wp=0 and the read pointers and flags are:

pr=[0 0 2 6 0 1 4]

fl=[0 1 1 1 0 1 1].

Using the same input and output streams as above, the first read cycle passes the input to the output for the first read pointer value of zero (fl=0), reads locations 0, 2, and 6 from the memory, then passes the next input value to the output (fl=0) and reads locations 1 and 4. The first seven samples of the output are:

$y_0:y_6=[x_0 0 0 x_1 0 0]$.

The write pointer for the first write cycle is:

pw=[0 0 1 2 4 6 0], and the memory contains:

| index   | 0   | 1   | 2   | 3 | 4   | 5 | 6   | 7 | 8  |
|---------|-----|-----|-----|---|-----|---|-----|---|----|
| content | $x_6$ | $x_2$ | $x_3$ | 0 | $x_4$ | 0 | $x_5$ | 0 | 0. |

During the second read cycle, wp=1 and the read pointer and flags are:

pr=[1 1 3 7 1 2 5]

fl=[0 1 1 1 0 1 1], which provides the next seven output samples:

$y_7:y_{13}=[x_7 x_2 0 0 x_8 x_3 0]$.

The write pointer for the second write cycle is:

pw=[1 1 2 3 5 7 1], and the memory contains:

| index   | 0   | 1      | 2   | 3      | 4   | 5      | 6   | 7      | 8  |
|---------|-----|--------|-----|--------|-----|--------|-----|--------|----|
| content | $x_6$ | $x_{13}$ | $x_9$ | $x_{10}$ | $x_4$ | $x_{11}$ | $x_5$ | $x_{12}$ | 0. |

During the third read cycle, wp=2 and the read pointer and flags are:

pr=[2 2 4 8 2 3 6]

fl=[0 1 1 1 0 1 1], which provides the next seven output samples:

$y_{14}:y_{20}=[x_{14} x_9 x_4 0 x_{15} x_{10} x_5]$.

This is the same result as obtained above for the shift register implementation. It should be noted that every cycle I bytes are read, followed by a write of I bytes, and the memory is reused in such a manner that more than $(D-1)*(I-1)/2$ memory locations are never needed.

It should also be noted that the pointers for read and write, and the flag, can be computed in line. Optionally, the read pointer offsets and the flags are pre-computed and stored in an array of maximum size I by 2, where each array address contains two values—the read pointer offset and the flag. An efficient way of doing this is by attaching the flag bit (the flag only having a value of 0 or 1) to the read pointer offset as an extra bit, separating the two before use. Another implementation inverts the read pointer offset values when the flag is zero, testing for such negative values in the loop as these offsets are actually never used.

The complete loop for both the read and write cycles, as well as the pointer update, is as follows:

```
ml = (D – 1) * (I – 1) / 2
wp = 0
b = start of memory
do forever
    for j = 0 : I – 1
        if (fl(j) = 0)
            out = in;
        endif
        rp = b + (wp + drp(j))_ml
        out = mem(rp)
    endfor
    for j = 0 : I – 1
        if (dwp(j) ≠ 0)
            wp = b + (wp + dwp(j))_ml
            mem(wp) = in
        endif
    endfor
    wp = (wp + 1)_ml
enddo.
```

The read pointer is computed using the following procedure:

```
ml = (D – 1) * (I – 1) / 2;
for i = 0 : I – 1
    rowindx = 0;
    Dsum = 0;
    for j = 0 : I – 1
        dw = int(Dsum / I)
        rd = Dsum – I * dw
        dr = (rowindx)_ml
        rowindx = rowindx + dw
        if (rd = i – 1)
            dpr(i, 0 : 1) = [dr(int(Dsum / I) ~= 0)]
            break
        else
            Dsum = Dsum + D;
        end
    end
end.
```

The write pointer for an index n can be computed in line using:

```
Dsum = 0;
for i = 0 : n – 1
    dw = fix(Dsum / I)
    Dsum = Dsum + D
end.
```

The final step is the implementation of this method in an xDSL modem. Typically, the memory of such devices is implemented as a rectangular array of n rows by m columns. Thus, the memory addresses in the read and write pointers have to be translated to these coordinates. This is readily accomplished by methods well known to those of ordinary skill in the art. Once the number of rows (or columns) of the array are determined as nrows (or ncolumns), the indices are computed as:

row address=$int$(pointer), and column address=(pointer)$_{nrows}$.

In the example above, a memory of nine locations is used. This can be mapped to a square memory of three rows by three columns. Thus, address 4 maps to memory location (1,1), while address 8 maps to memory location (2,2), and so on. Mapping the pointer addresses to the address memory locations provides the following array:

|     | column |   |    |
| --- | --- | --- | --- |
| row | 0 | 1 | 2 |
| 0 | 0 | 1 | 2 |
| 1 | 3 | 4 | 5 |
| 2 | 6 | 7 | 8. |

Although the present invention has been illustrated and described herein with reference to specific examples and preferred embodiments thereof, it will be readily apparent to those of ordinary skill in the art that other examples and embodiments may perform similar functions and/or achieve similar results. All such equivalent examples and embodiments are within the spirit and scope of the present invention, are contemplated thereby, are intended to be covered by the following claims.

What is claimed is:

1. A method for implementing a general convolutional interleaver, the method comprising:
    dividing an incoming data stream to a digital subscriber loop system into blocks of I bytes, wherein I is an interleaver block size in bytes;
    mapping each member of a block into a set of first-in, first-out shift registers (FIFOs) arranged in rows, wherein the number of elements nd in a row j is given by:

$nd(j) = int(j \cdot D/I), j=0, \ldots, I-1,$ wherein $int(j \cdot D/I)$ is an integer part of $j \cdot D/I$ and D is an interleaver block depth in bytes, and wherein using the number of elements in a row j as nd(j) provides general convolutional interleaving with no constraints, in an efficient manner, using $(D-1)*(I-1)/2$ memory locations for interleaved data in all cases;
    shifting the set of first-in, first-out shift registers (FIFOs) as the mapping step is performed; and
    reading elements shifted out of the set of first-in, first-out shift registers (FIFOs) in a different order from how they were mapped into the set of first-in, first-out shift registers (FIFOs), wherein the different order comprises reading indices of rows given by id(j), wherein id(j) is determined by:

$r(j) = rem(j \cdot D/I) = j \cdot D - nd(j) \cdot I, j=0, \ldots I-1,$ and $id(r(j)) = j, j=0, \ldots, I-1,$ wherein $rem(j \cdot D/I)$ is a remainder part of $j \cdot D/I$.

2. The method of claim 1, further comprising providing an integrated circuit device comprising the set of shift registers.

3. The method of claim 1, wherein the shift registers are mapped to a general memory structure.

4. The method of claim 1, wherein the shift registers are mapped to a linear memory array comprising two pointers, a write pointer offset to write data to the linear memory array and a read pointer offset to read the data.

5. The method of claim 4, wherein, for each block, the pointers cycle through I values.

6. The method of claim 4, wherein the write pointer offset dwp is defined as the number of elements in each row of the FIFOs:

$$dwp(j) = int(j \cdot D/I), j = 0, \ldots, I-1; \text{ and}$$

wherein the read pointer offset drp is defined as:

$$drp(k) = \text{summation} (j = 0 \text{ to } id(k) - 1) dwp(j), \text{ if } id(k) \geq 1, \text{ and}$$
$$= 0 \text{ if } id(k) = 0.$$

7. The method of claim 6, wherein a flag fl is defined to indicate if a target row to be read has zero elements, as follows:

$$fl(k) = 1 \text{ if } wp(id(k)) \neq 0, \text{ and}$$
$$= 0 \text{ if } wp(id(k)) = 0,$$

wherein wp comprises a write pointer.

8. The method of claim 7, wherein the process is staffed by setting wp to zero and reading I bytes from the memory at locations specified by the read pointer, except that reads corresponding to rows with zero bytes (dwp=0) are taken directly from an input stream.

9. The method of claim 8, further comprising designating a next input from the input stream as "in" and a next output to the output stream as "out", wherein a read operation is:

```
for j = 0 : I - 1
    if (fl(j) = 0)
        out = in;
    endif
    rp = b + (wp + drp(j))_{ml}
    out = mem(rp)
endfor,
``` wherein rp is a read pointer, wp is a write pointer, ml is a size of the memory $(D-1)*(I-1)/2$, b is a first location of the memory, mem(rp) is a memory location indicated by rp, and $(x)_m$ stands for a modulo operation—the remainder after x is divided by m.

10. The method of claim 9, further comprising writing I bytes to the memory at locations specified by the write pointer, with the exception that no data is written for rows corresponding to dwp=0, wherein a write is:

```
for j = 0 : I - 1
    if (dwp(j) ≠ 0)
        wp = b + (wp + dwp(j)))_{ml}
        mem(wp) = in
    endif
endfor,
``` wherein mem(wp) is a memory location indicated by wp.

11. The method of claim 10, further comprising incrementing wp by 1 modulo ml and repeating a cycle.

12. The method of claim 7, wherein the read pointer and the flag are pre-computed and stored in an array of maximum size I by 2, and wherein an array address comprises two values—the read pointer and the flag.

13. The method of claim 4, wherein the read and write pointers are computed in line.

* * * * *